US006709962B2

(12) United States Patent
Berg

(10) Patent No.: US 6,709,962 B2
(45) Date of Patent: Mar. 23, 2004

(54) PROCESS FOR MANUFACTURING PRINTED CIRCUIT BOARDS

(76) Inventor: N. Edward Berg, 70 Horizon Dr., Bedford, NH (US) 03110

( * ) Notice: Subject to any disclaimer, the term of this patent is extended or adjusted under 35 U.S.C. 154(b) by 0 days.

(21) Appl. No.: 10/183,574

(22) Filed: Jun. 27, 2002

(65) Prior Publication Data

US 2003/0179557 A1 Sep. 25, 2003

Related U.S. Application Data

(63) Continuation-in-part of application No. 10/139,311, filed on May 6, 2002, which is a continuation-in-part of application No. 10/100,927, filed on Mar. 19, 2002.

(51) Int. Cl.$^7$ .............................................. H01L 21/44
(52) U.S. Cl. ......................... 438/599; 438/16; 438/17; 438/7; 438/8; 438/9; 438/10
(58) Field of Search ........................... 438/599, 16–17, 438/770, 800

(56) References Cited

U.S. PATENT DOCUMENTS

| 4,661,431 | A | | 4/1987 | Bujese et al. ............... 430/126 |
| 4,737,858 | A | * | 4/1988 | DeBaryshe ................. 358/296 |
| 4,763,157 | A | | 8/1988 | Bujese ..................... 355/3 TR |
| 5,382,315 | A | | 1/1995 | Kumar ....................... 156/643 |
| 5,470,644 | A | | 11/1995 | Durant ....................... 428/209 |
| 5,489,985 | A | | 2/1996 | Mochida et al. ............. 356/398 |
| 6,080,606 | A | | 6/2000 | Gleskova et al. ........... 438/151 |
| 2002/0154187 | A1 | | 10/2002 | Wong et al. .................... 347/17 |

OTHER PUBLICATIONS

Advanced Process Control Framework Initiative (APCFI) Project Tech Transfer # 99053735A–TR International Sematech. Jun. 30, 1999. >> www.sematech.org/public/docubase/document/3735atr.pdf≦≦ visited Sep. 15, 2003.*
Maccanelli, M. et al."Practical Applications or Automated Fault Diagnosis at the Chip and Board Levels" 1992 Int'l. Workshop on Defect and Fault Tolerance in VLSI Systems. IEEE 0–8186–2837–5/92 pp. 297–304. 1992.*

* cited by examiner

Primary Examiner—Craig A. Thompson
(74) Attorney, Agent, or Firm—Hayes Soloway P.C.

(57) ABSTRACT

A method for producing printed circuits utilizing direct printing methods to apply a pattern mask to a substrate. The direct printing methods include correcting positional errors in a printing apparatus by ascertaining the errors in the printer through comparison of a printed pattern and a known standard pattern. Printer inputs are manipulated to compensate for the ascertained errors of the printer. The pattern mask applied by the corrected printer may be an etch resist mask for forming conductive pathways by an etching process, or the pattern mask may be a plating mask with conductive pathways being formed by a plating operation. The process of the present invention is applicable to forming both single-sided and double-sided printed circuit boards.

64 Claims, 7 Drawing Sheets

PROCESS FOR MANUFACTURING PRINTED CIRCUIT BOARDS

CROSS-REFERENCE TO RELATED APPLICATIONS

The present application is a continuation in part of U.S. patent application No. 10/139,311 filed on May 6, 2002, which is a continuation in part of U.S. patent application No. 10/100,927 filed on Mar. 19, 2002. The teachings of both applications are incorporated herein by reference.

FIELD OF THE INVENTION

The present invention relates to a process and apparatus for forming single-sided, double-sided, or multi-layer circuit boards.

BACKGROUND OF THE INVENTION

The manufacture of printed circuit boards generally follows either subtractive or additive processing techniques. According to a general subtractive process for the manufacture of printed circuit boards, a conductive layer laminated to a non-conductive substrate is selectively removed to leave a desired pattern of conductive pathways. The pattern of conductive pathways is typically formed by providing the conductive layer with a resist film, for example containing photosensitive organic monomers. Upon exposure to ultraviolet light, the photosensitive organic monomers polymerize, forming hardened regions. Two types of resists are in common usage today: dry film resists, containing a thin film of photosensitive monomers covered by a ultraviolet-transparent protective film, and liquid resists, also containing photosensitive organic monomers, often present in a solution allowing application as a liquid.

Once the resist has been applied to the conductive layer, the resist is photo-imaged, i.e., selectively exposed to an appropriate ultraviolet light source. An imaging mask is interposed between the source of ultraviolet light and the circuit board containing the resist. The imaging mask includes an ultraviolet-opaque member having an ultraviolet-transparent pattern therein. Accordingly, when the circuit board is photo-imaged only those regions corresponding to the ultraviolet-transparent pattern will be exposed and polymerized.

Subsequent to imaging, the unexposed, and therefore un-polymerized regions of the resist are removed, as through the use of appropriate solvents. The regions of the conductive layer not protected by the polymerized resist are then removed using an acid or alkaline solution. Once the resist has been removed, the non-conductive substrate is left containing the conductive layer in the pattern corresponding to ultraviolet-transparent pattern of the imaging mask.

Additive processes for the manufacture of printed circuit boards typically begin with a non-conductive substrate upon which conductive pathways are selectively added. Consistent with a conventional additive process, a non-conductive substrate containing a resist layer, such as those employed during subtractive methods. The substrate bearing the resist layer is imaged with a negative photo-resist, wherein only those regions corresponding to the desired pattern of conductive pathways remains unexposed. Accordingly, when the resist is developed, i.e., the un-polymerized resist is removed, the non-conductive substrate is exposed in the regions corresponding to the desired conductive pathways. Plating the exposed portions of the non-conductive substrate with a conductive material, and then removing the polymerized regions of the resist completes the process.

SUMMARY OF THE INVENTION

A process for forming a printed circuit including correcting the inherent positional errors of a printer, using the corrected printer to print an etch resist mask directly onto a conductive layer of the circuit board, and then removing the regions of the conductive layer that are not covered by the etch resist mask. The positional errors of the printer are corrected by first ascertaining the positional errors of the printer. This may be accomplished by printing a test pattern that is representative of a known standard pattern. The printed test pattern may then be compared with the known standard pattern in order to determine any deviation of the printed test pattern from the standard pattern. Printer inputs may then be manipulated to compensate for the ascertained errors, whereby printed patterns overcome the inherent errors of the printer. Advantageously, error correction of the printer also includes the use of servomechanisms to control the feed of the substrate through the printer, as well as for triggering print initiation.

Once the printer has been corrected to overcome inherent positional errors, the printer is used to print and etch resist pattern mask directly onto a conductive layer that is disposed on a printed circuit substrate. The pattern mask printed directly onto the conductive layer may correspond to a desired pattern of conductive pathways in the printed circuit. Subsequently, any regions of the conductive layer not protected by the etch resist pattern mask may be removed from the substrate, as by an etching process.

According to another aspect, an error corrected printer may be used to print a plating resist mask directly onto a portion of a printed circuit substrate. A conductive material may then be applied to those regions of the printed circuit substrate not protected by the plating resist mask. Thereafter, the plating resist mask may be removed from the printed circuit substrate, along with any conductive material not corresponding to those regions of the printed circuit exposed by the plating resist mask.

The invention herein is also applicable to forming two-sided printed circuit boards, both by etching and by plating. A two-sided printed circuit may be formed consistent with the present invention by respectively printing either an etch resist pattern mask, or a plating resist pattern mask to a second side of the printed circuit substrate. Desirably, a printed circuit formed on a second side of the substrate is also formed by printing the pattern mask using an error corrected printer.

The process of the invention herein may also be used to fabricate multiplayer laminate printed circuit boards. Individually formed printed circuit boards, either single sided or double sided, may be laminated into a composite structure, wherein the individual printed circuits are generally isolated one from another by interleaved insulating layers.

Furthermore, the present invention relates to a method of printing a pattern mask and/or a pattern of conductors directly to a substrate, such as an etch resist mask applied to a conductive layer on a substrate or a plating mask applied to a surface of substrate. The method consistent with the present invention includes printing a first pattern mask to the substrate, or a conductive layer disposed thereon, using a printer that has been corrected for inherent positional errors. Subsequent to printing the first pattern mask, the position and/or orientation of the first pattern mask is detected. Alternatively, the substrate may be held in a fixed orientation on a substrate feed system, whereby the position and orientation of the first pattern mask is prevented from shifting from a known position. The position and orientation of the first pattern mask may be know by the fixed orientation of the substrate, or may be detected using such techniques as optical scanning or laser scanning the surface of the substrate in order to determine the precise placement and orientation of the first pattern mask. Based on the detected position and/or orientation of the first pattern mask, a second pattern mask or conductor is printed onto the substrate. The second pattern mask may be printed in register with the first pattern mask, or in complimentary manner relative to the first pattern mask. Consistent with this method, the second pattern mask may be precisely positioned on the substrate in order to accommodate any positional and/or orientation errors that may have occurred during the printing of the first pattern mask.

BRIEF DESCRIPTION OF THE DRAWINGS

The present invention is described herein with reference to particular exemplary embodiments as shown in the following drawings, wherein.

DETAILED DESCRIPTION OF THE INVENTION

The method of manufacturing printed circuits consistent with the present invention may be carried out on most conventionally known printed circuit substrates of a general structure including a non-conductive member having a top surface and a bottom surface. While the process consistent with the present invention is susceptible for use to form a single sided circuit board having a conductive layer, or foil, disposed on one side, consistent with the exemplary example respectively disposed on the top surface and the bottom surface are a first conductive layer, or foil, and a second conductive layer, or foil. The non-conductive member may include a fiber-reinforced thermoset composition, a molded thermoplastic material, a ceramic material, a glass material, a stiff cardboard material, epoxy glass, polymeric film or sheet, TEFLON, etc., as well as mixtures of the above. Furthermore, the substrate may be provided as either a rigid member or a flexible member. The degree of flexibility of the substrate is generally dictated by the non-conductive member. An exemplary rigid substrate may include an FR-4 type epoxy material. The non-conductive member may be provided having a thickness in the range of between about 0.0001 and 0.124 inches, and preferably between about 0.001 and 0.062 inches in thickness.

The first and second conductive layers, or foils, may be metallic films having a thickness between about 0.0002 and 0.010 inches. The first and second conductive layers may be generally coextensive with the non-conductive substrate, or may optionally be sized to provide an exposed border of the non-conductive member around the perimeter of the conductive layers. Additionally, the first and the second conductive layers may include the same material, or may be formed from different materials. Preferably, both the first and the second conductive layers are formed from copper.

Figure 1:
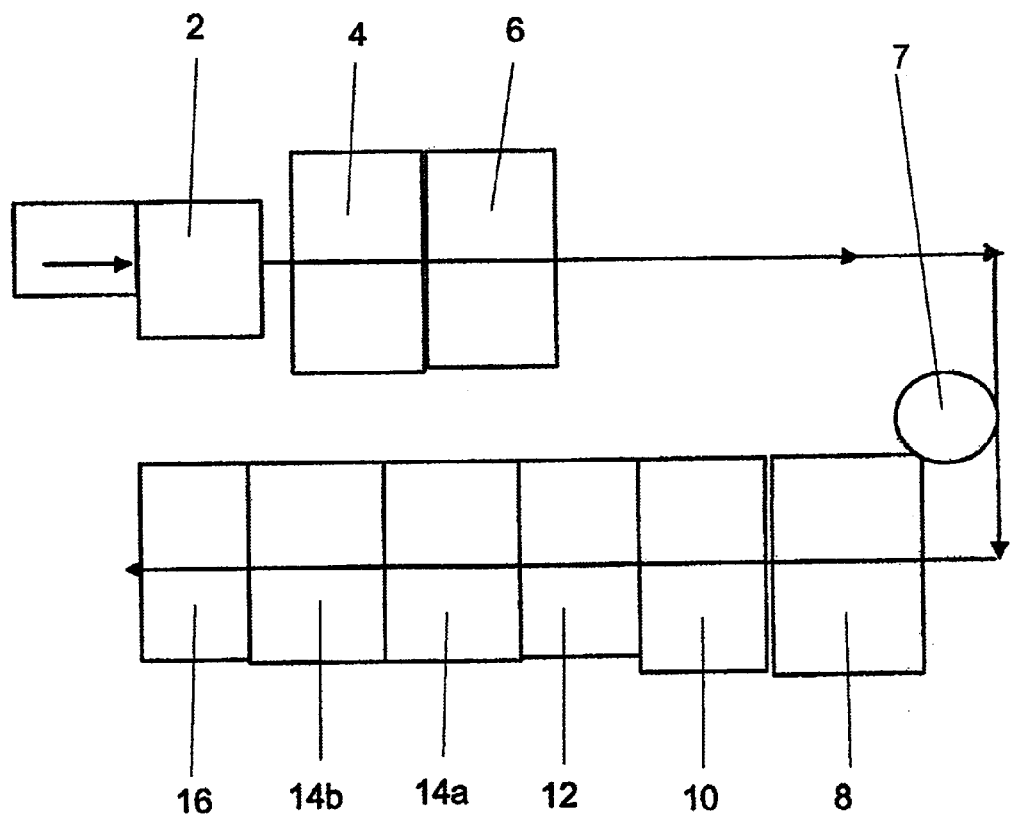
FIG. 1 is a schematic drawing of an exemplary manufacturing process consistent with the present invention.

Referring to FIG. 1, an exemplary embodiment of the process consistent with the present invention is schematically illustrated. According to the illustrated embodiment, the substrates are first pre-treated 2 to prepare the conductive layers for further processing. Next, at least one conductive layer receives an etch resist or plating pattern mask 4 by direct toner deposition, the mask thereafter being set or cured 6. Subsequently, a second conductive layer may be direct toner imaged 8, thereby forming an etch resist mask on the second conductive layer. The second etch resist mask may then be set or cured 10. Thereafter, the substrate may be etched 12 to remove any portions of the first and second conductive layer not covered by the respective first and second etch resist mask. Once the substrate has been etched, the etch resist masks may be removed 14a and 14b, and the surface of the substrate may optionally be cleaned 16.

As illustrated in the schematic manufacturing process shown in FIG. 1, while not required, the process herein may advantageously be carried out as a continuous, or semi-continuous manufacturing process. A plurality of individual substrates may be continuously transported from one processing station to the next, with the various processes being carried out on the substrates while they are in continuous motion. Alternatively, a start-stop, semi-continuous manufacturing scheme may include the use of accumulators to accommodate differences in the time required for the various processing steps. The use of a semi-continuous manufacturing scheme additionally allows slower processes to be carried out in parallel. Individual substrate may then be spliced together into a web for further processing. This manufacturing scheme of the present invention may be achieved by carrying the substrates on a web, or conveyer. Accordingly, the individual substrates may be secured to the web by means such as pins, clips, edge gripping jaws, etc. Alternatively, the individual substrates may travel along a pair of parallel drive rails, chains, etc., wherein the substrates are secured about opposed edges. Still alternatively, the substrates may be conveyed through a manufacturing line by a series of robots that move the substrates from one processing station to another. In a further embodiment, in the case of a flexible substrate, the substrate itself may be a continuous web. In this instance the substrate may be fed, as from a roll, and guided through a manufacturing line by a series of driven and idle rollers, etc.

Still alternatively, a plurality of substrates may be linked together to form a "mini-web". The mini-web may be formed by joining the individual substrates, as by a flexible joint therebetween, or by retaining the substrates adjacent to one another along a track or transport mechanism. In this manner, several mini-webs may be individually masked, or imaged, and subsequently joined, as in an accumulation stage, into a longer web for subsequent processing.

The pre-treatment step 2 of the exemplary process is undertaken to clean the first and the second conductive layers. The pre-treatment step not only cleans any oxide deposits or coatings from the conductive layers, but also may optionally slightly roughen the surfaces of the conductive layers. The produced surface roughness provides a surface having enhanced mechanical bonding characteristics, for any coating that may be subsequently applied. The cleaning process preferably includes a scrubbing, or mild abrading process, and may additionally include the application of a surface treatment coating or wash.

The pre-treatment process may generally follow a conventional chemical machine polishing (CMP) process. Advantageously, a mild abrasive may be employed for the cleaning of the first and the second conductive layers. Advantageously, the pre-treatment process further involves the use of a mild polishing agent to reduce the scrubbing time required to achieve the desired level of cleaning while keeping the risk of removing too much of the conductive layers to a minimum. The polishing and cleaning agent is a mixture or composition obvious to those who are knowledgeable in the art, which not only serves as a polishing agent, but also provides the advantages of being easily cleaned/removed from the pre-treated boards and being, generally, environmentally friendly.

According to the next step in the exemplary process, a first pattern mask may be applied to portions of the first conductive layer 4, whereby other portions of the first conductive layer remain exposed. The first pattern mask may be applied corresponding to a desired conductive pathway, or plurality of conductive pathways that make up the printed circuit. Consistent with the present invention the first pattern mask may be applied to the first conductive layer using a direct toner imaging technique. Preferably, the pattern mask is a toner applied by laser printing or an etch resist ink applied by ink jet printing. The pattern mask may also be applied to the first conductive layer by an ink jet printer or laser printer in off-set mode, using, for example, a belt or a drum to effect application of the etch resist ink or toner to the first conductive layer.

Alternatively, the pattern mask may be applied using various other printing techniques. Such additional printing techniques may include, for example, electrostatic printing, lithographic printing, intaglio printing, relief printing, etc. Consistent with all of these processes, an ink or toner may be applied directly to the surface of the conductive layer. Furthermore, all of the exemplary printing techniques may be employed in either a direct printing or offset printing mode. In consideration of the applicability of numerous printing techniques that may be employed consistent with the present invention, any description as to one process should be considered equally applicable to the others.

As a side-note, any plates that may be used for relief printing, intaglio printing, and planographic printing may be produced using methods consistent with the instant invention. Specifically, metallic plates may have desired images direct toner imaged, and then be etched, all in a manner consistent with the techniques herein for manufacturing printed circuits.

In order to aid adhesion of the ink or toner to the conductive layer, and to prevent spread of the pattern, it may additionally be desirable to coat the conductive layer. Exemplary coatings may include, for example, a conventionally known etch resist film. Accordingly, the pattern mask may be printed directly to the coating. The exposed portions of the coating may be removed from the conductive layer prior to the etching process.

In addition to the pattern mask, identification, indexing, and/or timing markings may be applied to or printed onto the substrate. Such identification and/or timing markings may be directed for use in inventory control, quality control, reference indexing for additional printing, and assembly, etc. Obviously, it will be appreciated that any identification and/or timing markings will be applied to regions of the substrate that will not interfere with any circuit patterns being formed on the substrate. The identification and/or timing markings may be applied either to the topside or the bottom side of the substrate, for example using dual side printing. Additionally, it should be understood that while identification, timing and/or position markings may be applied in the same manner, and using the same materials/toner as the pattern mask, it is not necessary that such is the case.

Desirably, the first pattern mask, as well as any other markings may be printed using a generally conventional laser printer, as may be used for laser printing to paper. However, some modifications or alterations to the laser printer may be necessary to accommodate the process herein. For example, the image may have positional errors that must be compensated; therefore it is usually necessary to employ distortion correction software to compensate for fixed errors in the laser scanner.

All laser printers have distortions caused by irregularities in the scan direction of the polygon rotation and because not all surfaces on the polygon are exactly equal. These irregularities cause variations in the line-to-line dot positions in the scan direction. For this, and other reasons, it is necessary to compensate each of the individual printers used in the process, after ascertaining the systemic, or repeating errors. Once the presence and magnitude of these errors have been determined, distortion correction software is applied to modify the printing process to eliminate these errors. With distortion correction it is possible to achieve pattern masks that are generally free from any systemic error.

Distortion or error in the direction of feed, orthogonal to the laser scan, may be a function of the feed of the substrate through the printer. Incorporating external servo systems to provide movement of the print media, i.e., the substrate, through the printer, may eliminate these errors. While use of the printer's start of scan sensor may be adequate for distortion corrections, one aspect of the distortion-correction modification may include intercepting the printer's normal "go" signal, which initiates the printing operation. This print initiation may advantageously be coordinated with the servo system that moves the substrate through the printer.

Even with the above-two modifications, errors or distortions may still be present in the printing operation. Accordingly, distortion correction software may be applied to the printing operation to eliminate any lingering errors. Generally this may involve calibrating each individual printer to ascertain the presence and degree of any systemic error. All such known and repeating error may easily be removed or compensated for using distortion correction software.

One method of calibrating individual printers includes printing a test pattern and ascertaining the errors in the print pattern. For example, a grid test pattern may be printed, with the grid pitch representing the desired level of print accuracy. The printed grid pattern may be compared with a standard, i.e., a pattern of known accuracy. In this manner, any systematic errors, that is, any deviations from linearity or distortions in the pattern produced by the printer, may readily be detected. Once the systematic errors of the printer are known, the pattern to be printed may be adjusted to compensate for the known errors. Eliminating, or at least minimizing, the errors may require several sequential print runs and corresponding corrective adjustments.

In a similar manner, any optical/position detection scanners used in the manufacturing process may also be adjusted to compensate for errors. A grid standard may be scanned by the scanner, and the detected image then compared to the original standard. Any deviations between the pattern detected by the scanner and the original may be ascertained by the comparison and be correspondingly compensated in future detected patterns. The compensation function may advantageously be carried out via software that adjusts any scanned patterns according to the known error of the individual scanner.

Advantageously, each individual component may be error corrected, as opposed to error correcting the system. For example, an individual printer may include a software, hardware, or firmware module that locally adjusts a "pure" or unmodified input signal for the errors of the individual printer. In this manner, various apparatus may be added to, or swapped in and out of a production line without the need to calibrate or error-correct the entire production line.

In addition to the above methods of compensating for errors, the feed mechanisms of printers and scanners consistent with the present invention may also be modified to compensate for errors and to accommodate printing to the printed circuit substrates. Modifications of this variety may involve bypassing error signals resulting from removed paper trays, open covers, etc. The feed mechanisms are also desirably modified to be servo operated in order to ensure more accurate, consistent, and controlled motion of the substrates during printing. Implementing servomechanisms in this manner may further minimize printing errors in the feed direction.

The various aspects of compensating printers and/or scanners for inherent errors and of modifying the feed mechanism of a printer etc. may be generally termed "computer controlled imaging." Not only does computer controlled imaging provided a greater degree of accuracy and precision in the printing steps, but if the various elements, i.e., printers, scanners, etc., are individually corrected, elements of a manufacturing process may be replaced without having to recalibrate and compensate the system.

Light incident on the junction of the printing drum or belt and the printed surface tends to cause the toner to defocus, therein creating a blurred or light (low density) image. For this reason, it is desirable to modify the printer to reduce or eliminate access of ambient light to the printed surface. Appropriate modifications may simply include the use of light shields, i.e., opaque shields from the region just upstream of the print head, downstream to the cure station.

Several different commercially available toners are suitable for use with the present invention. A first exemplary toner is available from Hewlett Packard, which is a two-component toner. A second exemplary commercial toner, suitable for producing etch resist or plating resist or plating pattern masks, is available from Lexmark. The toner available from Lexmark is of a mono-component variety. Of these two exemplary manufactures of toner, it has been found that the two-component variety of toner provides better results for both etch resist masks and plating masks. Cartridge re-fillers constitute another source for both general types of toner, i.e., two component and mono component. Producers of other laser printers are also potential suppliers of toner. Generally the toner employed to form the pattern mask is of the dry toner variety. However, in the case of inkjet printing, liquid inks may be employed.

Also, it may be necessary to modify the printer's fuser. Printing on metal, i.e., the conductive layer, is difficult because the surface is not porous and the metal of the conductive layer conducts and radiates heat away. These characteristics may result in the spreading of the toner on the surface of the conductive layer, therein distorting the desired pattern mask. Providing a clean metallic surface that has been at least slightly roughened by chemical means and/or mechanical and surface treated, as described above with respect to the pretreatment process 2, should enhance the ability of the conductive layer to receive the toner image, i.e., the pattern mask.

Additionally, it has been found that the ability of the conductive layer to receive the toner image may be improved by providing an electrical voltage to the conductive layer of the substrate. This electrical voltage aids in the transfer of the toner from the print drum 24, or off-set roll or belt, to the conductive layer and helps to prevent the spread of the pattern image once it has been received on the conductive layer. The voltage is coupled to the print drum 24 and the conductive layer to which the pattern mask is being applied by respective leads. The voltage required to realize the benefits of this aspect of the present invention are largely determined by the conductive properties of the toner and any separation, or gap that may exist between the conductive layer and the print drum 24. Exemplary voltages may range in magnitude from between about 50–300 volts. In addition to being coupled to an appropriate voltage, modifications may have to be made to the printer to prevent interference with the printing operation by the applied voltage.

In addition to the above modifications to the printer, it may be necessary to mechanically modify the laser printer to allow substrates having the desired range of thickness to pass through, and be printed by, the laser printer, and to maintain the desired separation between the print head of the printer and the surface of the substrate. In some cases, it may be preferred that the print head actually contact the substrate, but with only a small amount of force being applied therebetween. In other cases, a greater separation between the print head and the substrate may be desirable. In either situation, it may be damaging for a large force to be applied to the print head by the substrate.

It should be noted that, as used herein, print head is meant to generically refer to both the print head of an inkjet printer, the print drum of a laser printer, as well as other printing mechanisms as may be applicable. Similarly, description given with reference to a laser print drum is equally applicable to an inkjet printer print head. Any instances wherein the terms and/or structures are not interchangeable will be readily apparent to those having skill in the art.

To this point, the various aspects that may be desirable in a printer for use in manufacturing a printed circuit have been described in terms of modifications to an existing printer. While this is certainly a viable option, such description has largely been put forth for the sake of understanding by comparison. The print engines of various printers may be acquired separately from the printer, and may be used to produce a ground-up purpose built apparatus for manufacturing printed circuits. As discussed above, such an apparatus may include the print engine, servo feed mechanisms, print initiation sensors, as well as processors or the like for carrying out "computer controlled imaging," as described herein.

When printing to relatively thin substrates, a conventional laser printer may often be used in a relatively unmodified condition. That is, the nip roll feed mechanism that is used to feed paper substrates in conventional laser printers may be suitable for feeding thin substrates on which a printed circuit is to be formed. However, even when a generally conventional feed system of a laser printer is used, it may still be desirable to modify the to provide a greater level of control of the feed of the substrate. Heightened control of the substrate feed may be achieved by providing servo control of the pinch rollers. It may also be beneficial to position sensors that are configured to sense the position and progress of the substrate as it is fed through the printer. The position sensors may also be used to control the initiation of the printing operation.

With regard to the direct toner imaging of thicker substrates, it may be necessary to modify the laser printer to a greater degree than simply providing for the feeding of thicker substrates. Substrates having a thickness greater than about 0.020 inches are often relatively rigid, and are also generally totally not flat. By not flat it is meant that the substrate may exhibit some degree of warpage or departure from lying in a mathematical plane. While this condition may be very minor, perhaps not even perceptible to the naked eye, the lack of flatness may result in damage to the laser printer and/or poor print quality. Therefore, the laser printer must be modified to accommodate any lack of flatness in the substrate in order to maintain a constant distance between the print head and the substrate. For these same reasons, the conductive layer on the substrate must not have any burrs, which may cause damage to the print head. In part, a servomechanism may be used to achieve and maintain a constant distance between the print drum and the substrate, wherein fine positional adjustments may be made to the print drum.

Figure 2:
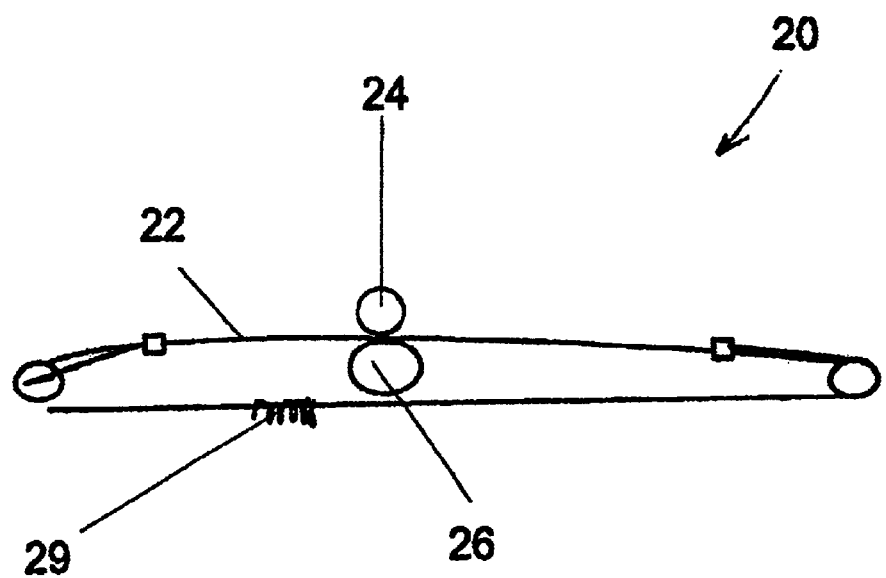
FIG. 2. illustrates a first exemplary substrate feed system consistent with the present invention.

Referring to the side view in FIG. 2, a first system for accommodating any lack of planarity in the substrate is generally illustrated at 20. Consistent with the system 20 illustrated in FIG. 2, a substrate carried by the transport mechanism 22 is imaged by a print drum 24. During the direct toner deposition, the substrate may be supported on the opposite side of the substrate 28 from the print drum 24 by a support roller 26. As shown in detail in FIG. 3 (note the relative dimension have been exaggerated for clarity), as the substrate 28 passes by, and is imaged by the print drum 24 the substrate 28 is forced into an arcuate configuration, with the curvature being in the direction of feed. As illustrated, the substrate is caused to bear against the support roller 26, presenting a convex surface relative to the printing roller 24. In this manner, the substrate 28 is caused to pass by the print drum 24 at a constant distance, within the tolerance of thickness of the substrate 28, from the print drum 24. While the amount of curvature induced on the substrate 28 is within the range of elastic deflection of the substrate 28, the stress placed on the substrate 28 is sufficient to eliminate most warpage, etc., in the region of the substrate 28 directly beneath the print drum 24.

The substrate 28 may be secured, and or transported through the printer, by various suitable means. One exemplary means may include clips or tabs or bands that secure the substrate 28 about either end, or along the sides. Additionally, the substrate may be controlled using a series of idle and/or driven rollers. Alternatively, the substrate may include a header portion and a footer portion that may be secured. According to this last, the header and footer may include a separate member adhered to the substrate, or may include a peripheral portion of the substrate.

Figure 3A:
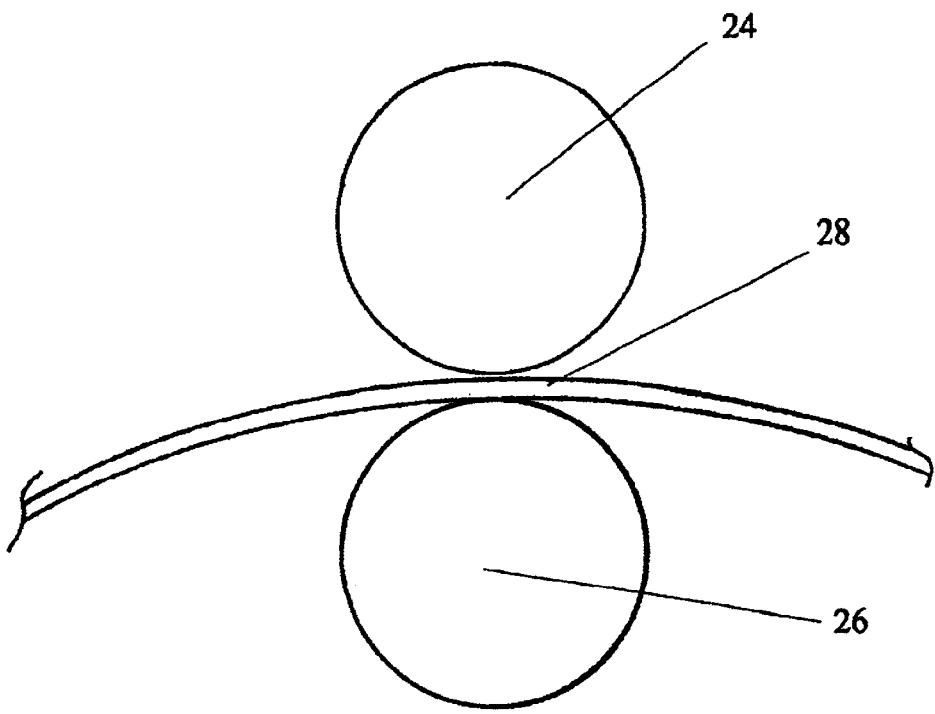
FIG. 3a is an enlarged drawing of a portion of the substrate feed system shown in FIG. 2.
Figure 3B:
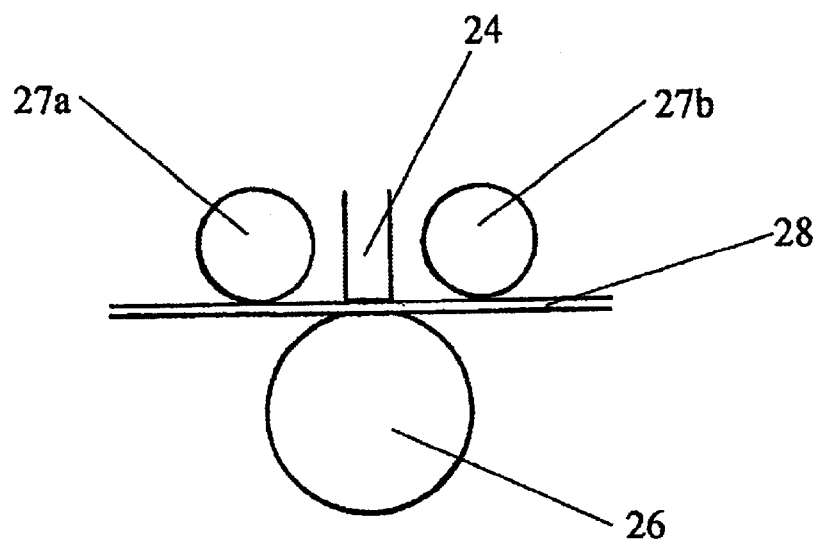
FIG. 3b is an alternative embodiment of the substrate feed system illustrated in FIGS. 2 and 3.

It should be noted that FIGS. 2 and 3 present an illustrative representation of the system only. The relative dimensions of the support roller 26 and the print drum 24 may be varied according to specific process requirements. For example, the support roller 26 may be either larger or smaller than the print drum 24 depending upon the desired amount of curvature to be induced in the substrate 28, as well as the stiffness of the substrate 28. Similarly, the positioning of the support roller 26 relative to the print drum may be varied. For example, the support roller 26 may be disposed above or beneath the print drum 24 to provide a generally horizontal tangent-printing plane. Alternatively, the support roller 26 may be disposed to one side of the print drum 24 to provide a generally vertical tangent-printing plane. Various other configurations will also be appreciated.

In addition to flexing the substrate 28 along the feed direction, it may also be desirable to place the substrate 28 in tension in the feed direction. As illustrated in FIG. 2, tension may be applied to the substrate 28, for example, through the use of a spring 29, or similar tensioning device. Preferably the tension applied to the substrate 28 is controllable, therein allowing the tension, as well as the flexure stress, to be variable. In this manner, it may be possible to control and optimize the feed of the substrate 28 without having to materially alter the feed apparatus.

According to a similar configuration, illustrated in FIG. 3A, the substrate 28 may be disposed between support roller 26 and print head, or print drum 24 as in previous FIGS. 2 and 3. In the system depicted in FIG. 3A, a force is applied to the substrate 28 by pressure rollers 27a and 27b, which are disposed adjacent to the print head 24. A three point bending force applied by pressure rollers 27a and 27b and support roller 26 may be utilized to minimize warpage of the substrate 28 in the region of the print head 24. Furthermore, by controlling the position of the pressure rollers 27a and 27b relative to the support roller 26, the substrate may be caused to flex around the support roller 26.

Consistent with the above described system/methods for applying bending and tension stress to the substrate, the distance between the first conductive layer of the substrate 28 and the print drum 24 may be varied. One way of varying this distance may be to provide the support roller 26 with the capability of being moved relative to the print drum 24 in a direction that is normal to the portion of the print drum surface where the conductive layer makes its closest approach to the print drum 24. The moveable facility of the support roller 26 relative to the print drum 24 allows the feed system shown in FIGS. 2 through 3A to be used with substrates 28 of different thicknesses. The feed system as described may even be adapted to provide feed for relatively thin and flexible substrates 28.

A similar system, not illustrated, may include flexing the substrate, as by coordinated rollers, into an arcuate configuration. As opposed to the above-described systems, rather than disposing the print head, or print drum to apply a pattern mask to a convex surface of the arcuate substrate, the print head may be disposed to apply a pattern mask to a concave surface of the flexed substrate.

Figure 4:
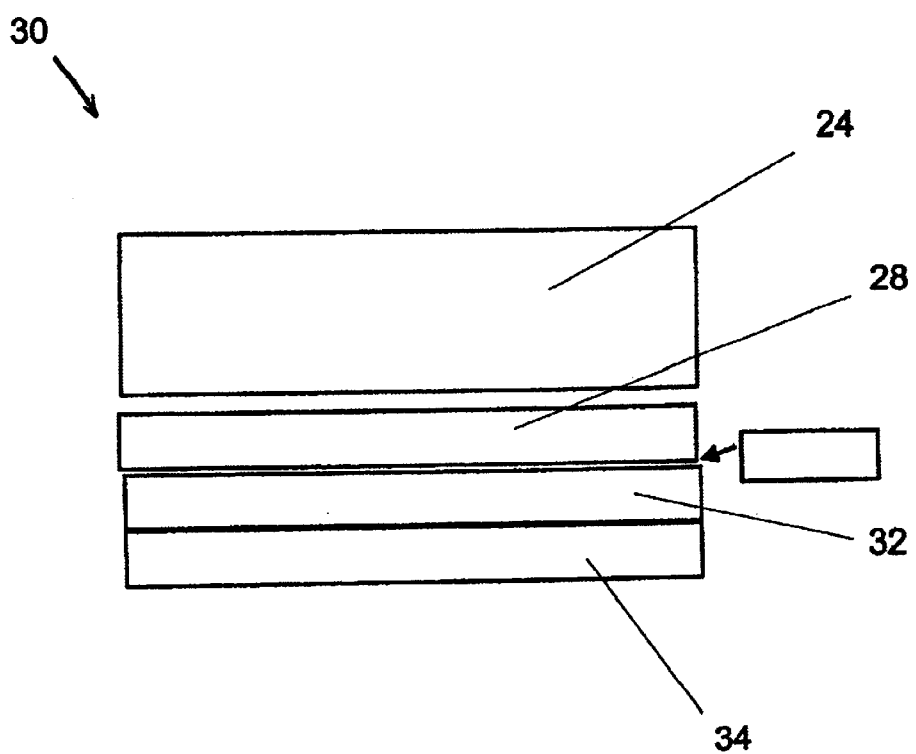
FIG. 4 is a cross-sectional view of a second exemplary substrate feed system consistent with the present invention.

Consistent with an alternative system, illustrated in FIG. 4, a rigid substrate 28 may be direct toner imaged using a flat platen arrangement 30. According to this system, the substrate 28 rides on a compliant member 32, which in turn is disposed on a rigid platen, or traveling bed, 34. The rigid platen 34 nullifies any flexure of the platen and substrate 28 along the direction of feed. The compliant member 32 supports the substrate 28 as it passes by, and is imaged by the print drum 24. However, the compliant character of the compliant member 32 allows relatively free movement of the substrate 28 in a direction that is generally normal to the drum surface where the substrate 28 makes closest approach to the print drum 24. In this manner, the maximum normal force that the substrate 28 may apply to the print drum 24 may be controlled by selecting the compliant member 32 having a predetermined resistance to deformation or deflection. Alternatively, moving the rigid platen relative to the print drum, thereby controlling the separation therebetween, may be used to control the force between the substrate 28 and the print drum 24. By selecting a compliant member 32 having a resistance to deformation that will allow displacement of the substrate away from the print drum 24 at a force less than a force that may damage the print drum 24, the likelihood of such damage may be reduced or eliminated. The relatively light pressure between drum and substrate flattens the substrate and makes up for sag and thickness variation in the support.

Numerous materials and structural configurations are available for producing a compliant member 32 that will give the desired characteristics. According to a first embodiment, the compliant member 32 may include a sheet or pad of an elastomeric material. Alternatively, the compliant member 32 may be an elastomeric member having cut-outs on at least one side, thereby enhancing the deflection or compliance of the structure. Additionally, the compliant member may be a cellular or foam material, such as a flexible expanded polymeric foam. Still alternatively, the compliant member may be in the form of a flexible container filled with a gaseous or liquid material.

Obviously, the system described above with reference to FIG. 4 will require that the substrate 28 be generally retained to the compliant member 32. If the substrate 28 is present without holes, or with a limited number of holes, the substrate may be retained in position during direct toner imaging by a leaky gasket vacuum system. Alternatively, the substrate 28 may be held in position on the compliant member 32 using clips, pins, or bands. According to yet another alternative method of retaining the substrate 28 in position during processing, a temporary adhesive may be disposed between the substrate and the compliant member, thereby retaining the former to the latter. Suitable adhesives may include, for example, pressure sensitive adhesive, double sided tape, soluble adhesives, etc. Various other methods of maintaining the substrate 28 in position on the compliant member, while still allowing displacement of the substrate 28 in a direction generally orthogonal to the tangent contact with the print drum 24, will be readily apparent to those having skill in the art.

Similar to the feed system discussed with reference to FIGS. 2 and 3, the flat platen feed system illustrated in FIG. 4 is susceptible to modifications depending upon the process requirements. As discussed above, the compliance of the compliant member 32 may be varied to control maximum contact pressure between the print drum 24 and the substrate. The optimum compliance is, at least in part, dependent upon the rigidity of the substrate 28, with a more easily deformable compliant member 32 being suitable for more rigid substrates 28 with a greater degree of warpage, in order to prevent damage to the print drum 24. Additionally, the orientation of the flat platen feed system 30 relative to the print drum may be varied depending upon the desired tangent-printing plane.

Both of the feed systems described above for use with direct toner imaging of a rigid substrate may also be suitable for use with printing methods operating in off-set mode. When the pattern mask is to be applied using off-set printing techniques, the feed systems illustrated in FIGS. 2 through 4 may be employed generally as described, however, instead of being applied directly by the print drum 24 the pattern mask will be applied by an off-set toner transfer drum or belt. The offset toner transfer drum or belt may be situated, and may operate in a manner generally corresponding to the print drum 24 shown in the figures.

In addition to the above-described systems for passing the substrate through a printer, the substrate may be held stationary, and the printing apparatus may be caused to move across the substrate. Such an arrangement may be achieved by incorporating a servo transport mechanism into the printing apparatus. Accordingly, the printer may be capable of translating relative to the substrate in a highly controlled manner, achieving the advantages of computer controlled imaging.

Due to unevenness in the substrate, poor affinity of the toner for the conductive layer, etc., a single printing pass may not be sufficient to provide the pattern mask with sufficient print density. In order to provide the pattern mask having a sufficient thickness, or print density, it may be necessary to print the pattern mask a number of times. Multi-pass printing may be accomplished by passing the substrate through a first laser printer again, or by passing the substrate through a series of printers, thereby achieving the same result. While specific feed systems have been discussed herein directed at limiting the effects substrate unevenness on print quality, the situation may still arise in which insufficient, or inconsistent print density is achieved in a single printing pass In the specific case of a relatively rigid substrate, print density may be inconsistent as a result of any unevenness of the substrate. Any such unevenness may have to be accommodated to achieve the desired level of print density. As applied to the system illustrated in FIG. 3, wherein unevenness of the substrate 28 is overcome by forcing the substrate 28 into an arcuate configuration, inconsistent print density may be overcome by making subsequent printing passes and adjusting the tension of the substrate 28 along the axis of the feed direction and/or adjusting the degree of curvature of the substrate 28 as it passes the print drum 24. By these techniques, the distance between the substrate 28 and the print drum 24 may be adjusted to optimize the print density of the toner applied to the substrate 28.

In the print feed system discussed with reference to FIG. 4, wherein a flat platen including a compliant member 32 is used to carry the substrate 28 during the toner application, poor print density may be overcome by placing shims under the substrate and making subsequent printing passes. The shims, when placed under low areas of the panel, may serve to raise such low areas, thereby bringing these low areas of the substrate to a more desirably distance from the print drum 24. In this manner poor print density due to excessive separation between the substrate 28 and the print drum 24 may be overcome.

When a relatively flexible substrate is employed with the present system, the problems associated with unevenness, or lack of flatness, are generally not present, or at least not as pronounced. Therefore, it may not be necessary to make significant modifications to the feed system of the printer. However, it may still be necessary to modify the feed mechanism to accommodate the thickness of the substrate. It may be possible to modify the feed mechanism in this manner by increasing the gap between the conventional printer feed rolls according to the substrate thickness.

Regardless of whether a single printer, or a series of printers are used to build up the necessary print density, and regardless of any techniques that may be employed to overcome lingering problems resulting from unevenness of the substrate, it is essential that any subsequent re-printing, or over-printing, of the first pattern mask be aligned with the toner pattern laid down during the first printing pass of the first pattern mask within the overall tolerances of the pattern mask. The first aspect of computer controlled imaging ensures that the print pattern will be accurately generated at the printer. However, the substrate should be aligned with the print head, and the feed of the substrate should be synchronized with the print head in order for the print pattern to be superimposed on the previously printed pattern mask.

According to a second aspect of computer controlled imaging, consistent with the present invention, proper alignment of the substrate relative to the print head, and proper synchronization of substrate feed may be provided by the use of additional hardware and/or firmware, such as an optical detector or the like, that is capable of detecting the presence and position of a previously printed pattern mask or indexing markings, such as discussed above. The hardware/firmware in conjunction with the indexing markings, previously printed on the substrate may be used to synchronize the feed of the substrate with the printing operation. Additionally, computer controlled imaging contemplates the use of appropriate error correction software allowing the detected indexing markings to be used to compensate for positional errors. The alignment of multi-pass printed pattern masks may, therefore, be improved by shifting or adjusting the pattern mask applied during each of any subsequent printing passes relative to the detected indexing markings.

This aspect of computer controlled imaging, consistent with the invention herein, may also be taken to an even higher level. The printer utilized to apply subsequent pattern masks, or to reprint a previously applied pattern mask, may be used in conjunction with an optical scanning system configured to detect a previously applied pattern mask, and to control placement of the subsequently applied pattern mask on the substrate based on the detected previously applied pattern mask. The data collected by the optical scanner may be used to ensure that a subsequently applied pattern mask precisely follows the previously applied pattern mask. In this manner, even if the previously applied pattern mask is imperfectly oriented or positioned on the substrate, the subsequently applied pattern mask will be positioned and oriented in register with the previously applied pattern mask.

As an alternative to detecting index markings printed on to a surface of the substrate, orientation and positioning of pattern masks on the substrate and/or relative to previously applied pattern masks may be achieved using through holes, or similar features, included in the substrate. Through holes, or similar features, may be detected in a similar manner as an applied index marking, e.g., optically, and employed to the same ends as an applied index marking. However, a feature such as through holes, provide a permanent reference on the substrate, and may, therefore, also be used in subsequent operations such as assembly of multiple printed circuits into a multi-layer circuit board.

After the first pattern mask has been applied to the substrate, the first pattern mask is set or cured. It is important that care is used in handling the printed substrate before and during the curing process. Unset toner has little adhesion to itself or to the surface of the printed substrate. Therefore, the printed pattern mask is susceptible to damage, such as by smudging, transfer to any contacting surface, or any other disturbing forces. The curing process for the pattern mask fuses the toner to the substrate, thereby increasing the bond strength between the first pattern mask and the first conductive layer. Additionally, the process of setting or curing the first pattern mask may enhance the mechanical properties of the first pattern mask, thereby reducing susceptibility to damage. However, careful process control is required in curing the toner. Improperly set toner may have poor adhesion to the substrate. Furthermore, over-cured toner may exhibit degenerated masking capabilities that may result in at least partial failure of the etch resist, or plating resist character of the pattern mask.

The first pattern mask may be set or cured thermally, for example, by baking or heat-treating the substrate including the first pattern mask in an oven. In the context of the exemplary etch resist toner, the first pattern mask may be set by heating the substrate, having the first pattern mask thereon, in an oven at a temperature of approximately 150° C. for a curing cycle of between approximately five minutes. In an alternative embodiment, the substrate having the first pattern mask thereon may be pre-heated to a moderate temperature of approximately 120° C. The temperature of the pre-heated substrate may then be increased over a period of about one minute to a higher (160° C.) temperature thereafter maintained for approximately five minutes. However, it should be appreciated that the exact temperature and time of the setting/curing cycle is dependent upon the toner employed to print the first pattern mask, and will therefore vary accordingly.

The curing cycle for the pattern mask is an especially critical process. If the pattern mask is over-cured or under-cured the pattern mask may exhibit poor stability on the substrate, e.g., poor adhesion to the substrate, poor masking properties, etc. The criticality of controlling the curing process is further compounded by the fact that a first applied and cured pattern mask may, effectively, experience two curing cycles. That is, the first pattern mask may experience a curing cycle when the first pattern mask is set, and then may also experience at least another partial curing cycle when a second pattern mask is cured.

When properly set (cured) the toner takes on a particular sheen, making it easy to determine if the toner has been properly cured. Therefore, an inspection station may advantageously be placed in a manufacturing line upstream of the curing station to inspect cured pattern mask. The inspection station may comprise, for example, an optical scanner wherein the reflective properties of the cured pattern mask may be evaluated. Accordingly, any substrates containing a pattern mask that is determined to be improperly cured may be removed from the manufacturing line without completing the manufacturing process. Depending upon the state of the curing defect, i.e., under cured or over cured, the defect may be remedied and the substrate now including a properly cured pattern mask may be reintroduced into the manufacturing line to undergo the remaining manufacturing processes.

Alternatively, the first pattern mask may be set or cured photo-metrically, by exposure to light of a predetermined wavelength. For example, the setting or curing process may include exposure to visible light, to IR, or UV radiation of an appropriate intensity for a predetermined duration. Further, it should be appreciated that additional methods of setting or curing the first pattern mask may be employed depending upon the exact make-up of the etch resist toner.

Figure 5:
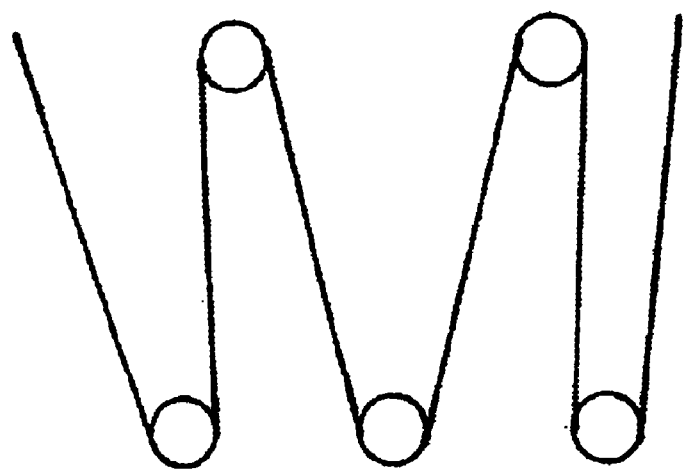
FIG. 5 is a schematic view of an exemplary serpentine feed system that may be used to form printed circuits consistent with the present invention.

In the context of a continuous manufacturing process, the controlling process with regard to line speed is generally the speed of the curing and mask removal processes. The printing process is generally the least adjustable, with respect to speed, but the output from a multiplicity of printers could be accumulated and joined, and thereafter undergo the remaining manufacturing processes. Therefore, the dwell time in the oven or cure station and the removal station is relatively large. The floor space, or footprint, of the oven, or cure station, may be reduced by establishing a serpentine path in the oven, such as that shown in FIG. 5. In this manner, a relatively long linear travel path may be established within the oven, while requiring a relatively small footprint or line footage. Numerous alternatives exist by which the same effect may be achieved, for example, a system of horizontal and/or vertical elevators within the oven, slowly rotating turntables within the oven, etc. In these manufacturing processes beyond imaging and setting care must be taken to protect the first imaged side from being damaged by appropriate roller radiuses and protective shields.

Optionally, the substrate including the first pattern mask may be post processed to refine the toner image. It may sometimes be the case that the pattern mask may have poorly defined edges, i.e., rough or ragged edges under magnification. After the toner pattern mask has been partially, or fully cured the edges of the pattern mask may be smoothed by exposure to a mild solvent. The dilute solvent acts to coalesce any small features into the main pattern of the toner mask. Exemplary solvents may include NMP (N-methyl pyrrolidone) and But-OxEtAc (2-butoxyethyl acetate). Similar solvents, such as cymene, xylene, and toluene, may also be employed to achieve the same result. Consistent with this process step, the solvents employed are preferably present in a very dilute state, as it is only desired to coalesce any fringe into the body of the printed pattern. An excessively strong solvent may damage the actual printed pattern.

With the first pattern mask set (cured) on the first conductive layer, a second pattern mask may be applied to a portion of the second conductive layer, leaving portions of the second conductive layer exposed. The second pattern mask is applied to the second conductive layer corresponding to a second desired conductive pathway, or plurality of desired conductive pathways. The second pattern mask may be of the same pattern as the first pattern mask, or may alternatively be of a different distinct pattern. Desirably, the second pattern mask is applied by directly printing the second pattern mask to the second conductive layer. Similar to the method by which the first pattern mask was applied, the second pattern mask is preferably applied by printing techniques including ink jet printing or laser printing, wherein each of these techniques may also be employed by printing in off-set mode.

In order to apply the second pattern mask, the substrate may be turned over, as illustrated in the schematic drawing of FIG. 1, by passing the substrate around a turning drum or roller 7, for example. In the case where the substrate is turned over, the second printer 8 may be disposed above the substrate. However, the second pattern mask may also be applied without turning the substrate over by disposing the second printer on the other side of the substrate. This second method may advantageously be employed in the case of a flexible substrate, being fed through the second printer using a nip roll type feed system, or in the case of a relatively rigid substrate when the substrate is caused to flex against a support roll, as described with reference to FIGS. 2 and 3. According to the latter method, the second printer may be disposed on the other side of the substrate, i.e., adjacent to the second conductive layer, wherein the substrate is stressed into a convex configuration relative to the second conductive layer. According to the latter method, the second printer may be disposed on the other side of the substrate, i.e., adjacent to the second conductive layer.

The laser printing apparatus 8 used to apply the second pattern mask may be of the same general variety as the laser printer employed to apply the first pattern mask. In some instances, the laser printer employed to apply the first pattern mask may even be used to apply the second pattern mask, wherein the substrate is re-fed through the first laser printer with the second conductive layer being oriented adjacent to the print head.

Obviously, the modifications and alterations associated with the first laser printer are equally applicable to the second laser printer. For example, the laser printer used to apply the second pattern mask may be modified to accommodate the thickness and rigidity of the substrate. Additionally, as with the laser printer used to apply the first pattern mask, the laser printer used to apply the second pattern mask may include distortion correction software to compensate for any fixed errors of the laser printer. Furthermore, the feed mechanisms, etc. associated with the second laser printer may be generally analogous to those employed with relation to the first laser printer.

As discussed with respect to the first pattern mask, it may be necessary to conduct more than one printing pass to achieved the desired print density, or mask thickness of the second pattern mask. As with the first pattern mask, the print density of the second pattern mask may be increased by reprinting the second pattern mask. Index markings, optical scan of the second pattern mask, etc., may advantageously be employed to accurately position any subsequent reprinted pattern mask relative to the originally applied second pattern mask. Accordingly, the necessary detection systems, e.g., optical scanners, etc., should be appropriately incorporated into the printing system of associated with the second pattern mask. Utilizing these systems, subsequent printing processes may be synchronized with the feed of the substrate, and the subsequently laid down toner masks may be aligned with the second pattern mask as originally applied.

Furthermore, as discussed with reference to the application of the first pattern mask, any shortcomings with respect to the print density may be the result of unevenness of the substrate that was not fully accommodated during the first printing pass of the second pattern layer. As with the printing of the first pattern mask, during subsequent printing, or re-printing operations carried out for the second pattern mask measures may be taken to further accommodate any unevenness of the substrate. Similar to the printing of the first pattern mask, unevenness in relatively rigid substrates may be accommodated through the use of shims disposed between the substrate and the compliant member on the platen, or by adjusting the tension and degree of curvature of the substrate, depending upon the method of feeding the substrate during the printing operation.

In consideration that it may be desirable to include vias, or other features on or relative to the respective printed circuits, it would be beneficial for the first and the second pattern mask to be precisely located relative to each other. Consistent with this, the substrate may be provided with a feature, or plurality of features, that serve as a basis for aligning and orienting each of the first and the second pattern masks. These features may include index markings that are printed before at least one of the first and the second pattern mask. Accordingly, any subsequently printed pattern mask may be located and oriented relative to the index markings. Alternatively, the feature(s) may include notches, holes, or other physical features disposed on the substrate, which may be detected using conventional means. In this instance, both the first and the second pattern masks may be positioned on the substrate relative to the features thereon.

According to a second alternative method consistent with the present invention, the second pattern mask may be oriented and positioned relative to the first pattern mask by optically scanning the first pattern mask. Consistent with this aspect, the first pattern mask may be optically scanned, the output of the optic scan being input to error correction software. The error correction software may then adjust the printing of the second pattern mask to be appropriately positioned and oriented relative to the first pattern mask. In this manner the orientation and position of the second pattern mask may be adjusted corresponding to any deviations in orientation and/or position of the first pattern mask. Therefore, the second pattern mask may be applied to the second conductive layer in accurate register to the first pattern mask.

According to yet another method, tooling pins may also be used to position the substrate so that the first pattern mask and the second pattern mask will be in register one with another. Tooling pins may be present wherein the pins are seated in holes in the substrate that are accurately aligned with a print feed mechanism, such as a platen, etc. Because the tooling pins are disposed in holes that pass through the substrate, the pins may just as readily be used to align a first side of the substrate for printing as the second side.

Similar to the process discussed above with reference to the first pattern mask, subsequent to being applied the second pattern mask is set or cured. While the same general techniques may be employed for setting the second pattern mask, i.e., baking, infrared exposure, ultraviolet exposure, etc., if a different toner or ink is used to form the second pattern mask, the exact curing techniques and/or parameters may vary accordingly.

After both the first pattern mask and the second pattern mask have been applied to the respective conductive layers and have been set or cured, the substrate may be etched to remove the exposed regions of the first conductive layer and the second conductive layer. The exposed regions of the first and second conductive layer may be removed using conventionally known etching solutions and techniques, the exact nature of which are dependent upon the nature of the metals of the conductive layers. The respective exposed regions of the first conductive layer and the second conductive layer may be etched either simultaneously or sequentially. The first and second conductive layers may be simultaneously etched by, for example, passing the substrate through a bath of etching solution, or spraying the substrate with an etching solution, whereby both the first and the second conductive layers may be exposed to the etching solution at the same time. Alternatively, the etching solution may be selectively applied to the first and the second conductive layers individually, thereby sequentially etching the individual conductive layers.

Once the conductive layers on the substrate have been etched, thereby reducing each of the first and the second conductive layers to a desired pattern, the first and the second pattern mask may be removed from the substrate. The pattern masks may be removed from the respective sides of the substrate using chemical and/or mechanical mask removal techniques. Exemplary chemical mask removal techniques may include dissolving each pattern mask in an appropriate solvent and/or weakening or breaking the adhesion between the pattern masks and the conductive layer to which each pattern mask has been applied. This process may be accelerated by providing the solvent in a heated condition. As an alternative to, or in addition to chemical mask removal techniques, the pattern mask may be removed by mechanical scrubbing and/or abrasive removal of the pattern masks. For example, a mechanical scrubbing action may be applied to a pattern mask to physically break the bond between the pattern mask and the underlying conductive layer. Alternatively, the pattern mask may be abraded, lapped, or ground down until the underlying conductive layer is completely exposed. Such abrasive removal techniques should be carefully controlled when applied to very thin conductive layers and/or very thin substrates to minimize damage to the conductive layer. Still alternatively, a combination of chemical and mechanical removal techniques may be advantageously employed to remove the pattern mask.

The process consistent with the present invention may conclude with a final scrubbing or cleaning process. Consistent with this final process, any remnants of a pattern mask, contaminants, etc, may be removed from the substrate. Additionally, the scrubbing or cleaning process may be employed to prepare the printed circuit board for additional processing, such as further etching, soldering, plating, the application of electronic components, etc. Exemplary scrubbing or cleaning processes may include either abrasive or non-abrasive scrubbing. Alternatively, or additionally, this final process may involve the use of solvents or cleaning agents.

Figure 6:
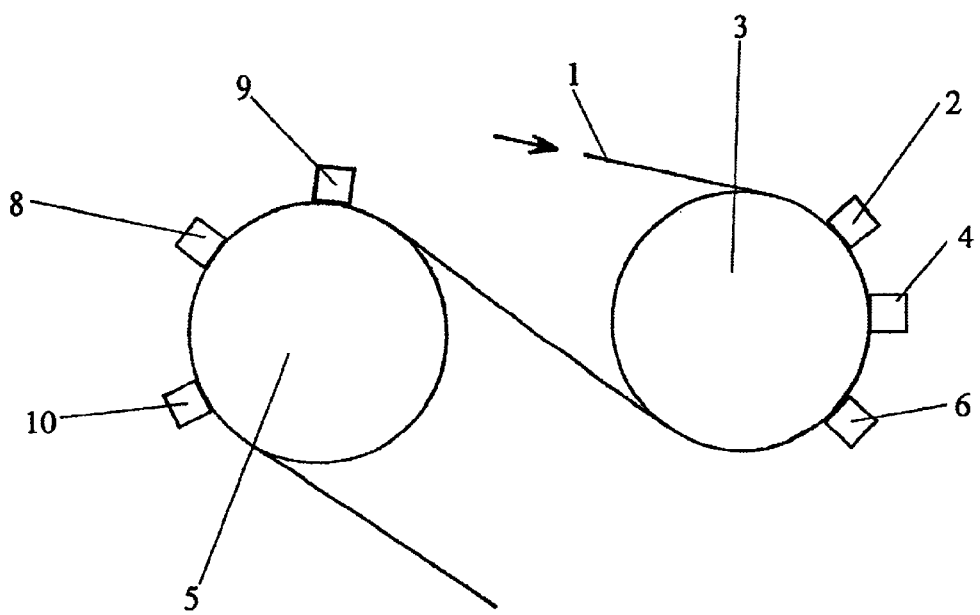
FIG. 6 is a schematic view of an exemplary system for producing a printed circuit consistent with the present invention.

Referring to FIG. 6, a schematic illustration of an exemplary system for use with the above-described method for producing a printed circuit consistent with the present invention is illustrated. With reference numerals for the various processes consistent with the schematic drawing of FIG. 1, a substrate web 1 travels in a serpentine manner over two support rolls 3 and 5, traveling in a direction indicated by the arrow. The substrate web 1 may be a flexible substrate, a single relatively rigid substrate, or a plurality of connected individual substrates. In the case of a single rigid substrate or a plurality of connected individual substrates, a plurality of idler or driven rollers may advantageously be employed to flex the substrate into conformance with the support rolls 3 and 5. While a system consistent with FIG. 6 used in conjunction with a flexible substrate may also employ idler or driven rolls to control the web 1, the web may also be controlled by adjusting the tension on the web 1 as it passes around the support rolls 3 and 5.

As the web 1 passes around the support rolls 3 and 5 it undergoes the various processes consistent with the invention herein. Accordingly, as the web 1 passes over the first support roll 3, the first conductive layer of the substrate may be sequentially cleaned 2, then have a pattern mask applied to the surface thereof 4, and finally the pattern mask may be set 6. In a similar manner, as the web 1 passes around the second support roll 5, the second conductive layer may be cleaned 9, and then have a second pattern mask applied to the second conductive layer 8. Finally, the second pattern mask may be set 10 on the second conductive layer. The further processing steps of etching, removing the pattern masks, etc. may also take place while the web 1 passes around the support rolls, or may take place at a later point in the processing line.

It should be appreciated that additional processes, not illustrated, may take place as the web passes around the support rolls 3 and 5. For example, after the first pattern mask is printed, the pattern mask may be analyzed for print density, and subsequently re-printed as necessary. Additionally, the printed pattern mask may be treated with a dilute mild solvent to coalesce any fringe of the pattern into the body of the printed pattern mask. Similar additional processes may be executed on the second support roll 5, with respect to the second pattern mask.

According to an alternative embodiment, a printed circuit may be produced using the general process as laid out above with reference to the application of an etch resist mask and subsequent curing of the etch resist mask and etching of the conductive layer of the substrate. The present alternative embodiment employs the use of a non-conductive substrate, as above, differing in that the conductive layer is very thin. A plating resist pattern mask is applied to the conductive layer of the substrate by directly applying a resist toner or ink to the conductive layer using a laser printer or inkjet printer. Furthermore, the plating resist mask may also be applied using a laser printer or an inkjet printer operating in offset mode. The plating resist mask is applied in a pattern that is the negative of the desired pattern of conductive pathways. That is, the plating resist pattern mask is applied to those regions of the conductive layer of the substrate in which it is desired to not have conductive pathways. Thereafter, the plating resist mask may be cured in a manner consistent with the curing processes described above with reference to the curing of the etch resist mask.

After the plating resist mask has been applied, the printed circuit may be plated, as by such known techniques as electro-plating and electroless plating, whereby a conductive material is deposited in those regions not covered by the plating resist mask. Subsequently, the plating resist mask may be removed, as by chemical and/or mechanical removal processes.

The printed circuit may then be etched, only to the degree necessary to remove the thin conductive layer that was protected by the plating resist mask during the plating process. While the plated conductive pathways, i.e., the regions that received conductive material during the plating process, may be reduced in cross-section, proper design of the plating resist mask and proper plating will leave these conductive pathways having the necessary thickness and width.

Consistent with another alternative embodiment of the present invention, a printed circuit manufacturing process is provided wherein a desired pattern of conductive pathways may be formed directly on a non-conducting substrate by printing using a conductive toner or ink. Desirably, the conductive toner may include a catalyst suitable for electroless plating, whereby the conductivity of the printed patterns may be enhanced. The catalyst included in the conductive toner or ink aids in ensuring that the plating will take place primarily on the imaged pattern areas. Generally, the process for direct toner application of conductive pathways follows the scheme as set forth above with respect to direct toner application of etch resist masks. However, some modifications to the general manufacturing process should be made.

A first modification that may be made to the manufacturing process, when tailored for the direct application of conductive pathways relates to the cleaning process. While the general process of pre-cleaning the un-coated butter board, i.e., the non-conductive substrate not including conductive layers, may be advantageous, as the substrate does not contain conductive layers this process may be limited to merely cleaning the surface of the substrate of contaminants.

Obviously, another modification to the process is the use of toner that will contribute electrically conductive characteristics, as opposed to providing chemical resistance. Even without problems related to unevenness of the substrate or poor print density, it may be desirably to make multiple printing passes. Through multiple printing passes the toner thickness may be built up to the degree needed to achieve the desired level of electrical conductivity in the finished printed circuit.

In order to maintain the electrical characteristics necessary for use with a printer, advantageously the toner will not exhibit substantial electrical conductivity until the toner has been cured. Toners exhibiting these characteristics include conductive polymers. The conductivity of the printed patterns may be further enhanced by doping the conductive polymers, for example, with iodine or similar substance. These conductive polymers may be used alone, or may be compounded with standard toners or other components to optimize both the conductive characteristics of the printed pathways as well as the printability of the polymer.

Even with the direct application of conductive toner to a non-conductive substrate it is desirable to provide an electrical voltage between the print drum, or offset roller or belt. However, because the substrate on which the conductive toner is being applied does not include a conductive layer, a removable conductive backing foil may be applied to the substrate during the printing process. The removable backing foil may be applied using an adhesive, mechanical fasteners, etc. Alternatively, in the case of a flat platen feed system, the removable backing foil may be disposed between the compliant member and the substrate. Still alternatively, the compliant member itself may be conductive, or provided with a conductive treatment such as a conductive foil layer. According to this embodiment, the removable backing foil or conductive compliant member may be coupled to an electrical voltage to enhance toner transfer to the substrate.

Still alternatively, in a system where the substrate is flexed around a support roll, as shown in FIGS. 2 and 3, or when nip rolls are use to feed the substrate, a conductive roll in contact with the substrate may be coupled to an electrical voltage to enhance the transfer of toner from the print drum to the substrate.

According to any of the above embodiments for providing an electrical voltage, it should be appreciated that a higher voltage may be required than is required in the case of direct toner deposition of a pattern mask to a conductive layer. This is because a non-conductive member, i.e., the substrate not including a conductive layer, is interposed between the print drum and the second conductive member coupled to the electrical voltage. Accordingly, the magnitude of the electrical voltage is not only related to the conductivity of the toner, and to the gap between the print drum and the substrate, but also to the thickness of the non-conductive substrate.

As mentioned with respect to the curing process of the first and the second etch resist pattern layer above, the curing process, specifically the temperature and time for curing the toner, is dependent upon the specific toner or ink employed to form the pattern layer. It should be appreciated that in the process consistent with this embodiment of the invention the same principles apply. Therefore, the exact curing cycle utilized with respect to the direct application of conductive toner or ink will similarly vary depending upon the exact nature of the toner employed to form the conductive pathways.

Obviously, because the substrate does not contain a conductive layer that must be etched to produce the desired pattern of conductive pathways, there is no need to perform an etching step. Similarly, because the directly applied toner or ink itself makes up the conductive pathways of the printed circuit board, the process will not include a step of removing the toner mask from the substrate. Furthermore, it may be desirable to eliminate the final cleaning process, or at least diminish the intensity, in order to prevent damage to the directly applied toner or ink conductive pathways. These conductive pathways may need to be built up for conductivity or strength reasons. The required build up may be achieved by, e.g., electroless plating, direct metallization, etc., which will plate primarily on the conductive toner or ink pattern because of the catalyst included therewith. Alternatively, of course, multiple printing passed may be employed to build up sufficient conductor thickness, rather than plating operations.

The printed circuit manufacturing process relating to the direct printing of a desired pattern of conductive pathways on to a non-conducting substrate may also advantageously be carried out in a continuous manner, as described previously with reference to printed circuit manufacturing employing direct printing of an etch resist pattern mask to a conductive layer of a printed circuit substrate. Of course, the continuous manufacturing process will be modified in accordance with the considerations discussed above.

The printed circuit boards manufactured according to the present invention are suitable for additional processing as in known in the art. Specifically, the process according to the present invention is susceptible to additional direct printing of circuit devices, insulators, and vias as described in International Application Number PCT/US00/02543 filed Feb. 1, 2000, the entire disclosure of which is incorporated herein by reference.

Furthermore, the double sided nature of printed circuit boards achievable with the process consistent with the present invention may be suitable for the production of multi-layer laminated circuit boards, that may include buried vias, wherein numerous printed circuit boards may be laminated into a composite structure including interleaved printed circuit boards separated by insulating layers. The individual, but isolated printed circuit boards included in such a laminated composite structure may be selectively electrically coupled one to another by way of plated vias and plated through holes extending therebetween, etc.

It will be appreciated that the exemplary embodiments described and depicted the accompanying drawings herein are for illustrative purposes only, and should not be interpreted as limiting. It is obvious that many other embodiments, which will be readily apparent to those skilled in the art, may be made without departing materially from the spirit and scope of the invention as defined in the appended claims.

What is claimed is:

1. A process for forming a printed circuit comprising:
    ascertaining positional errors in a printer by printing a test pattern representative of a known standard, and comparing the printed test pattern to the known standard;
    manipulating printer inputs to compensate for the ascertained positional errors, whereby the printer is corrected for positional errors;
    printing an etch resist mask with the corrected printer directly onto at least a portion of a conductive layer disposed on a substrate, leaving at least an exposed portion of the conductive layer; and
    removing the exposed portion of the conductive layer.

2. The process according to claim 1 wherein printing an etch resist mask comprises laser printing an etch resist mask.

3. The process according to claim 1 wherein printing an etch resist mask comprises offset printing an etch resist mask using a laser printer in an offset mode.

4. The process according to claim 2 wherein printing an etch resist mask comprises laser printing an etch resist mask comprising dry toner.

5. The process according to claim 1 further comprising setting the etch resist mask by heating the etch resist mask.

6. The process according to claim 1 further comprising setting the etch resist mask by exposing the etch resist mask to at least one of infrared radiation and ultraviolet radiation.

7. The process according to claim 1 wherein printing the etch resist mask comprises at least one of the techniques of electro-photographic printing, electrostatic printing, lithographic printing, relief printing, and intaglio printing an etch resist mask.

8. The process according to claim 1 comprising cleaning a surface of the conductive layer by chemical-machine-polishing the conductive layer with a mild abrasive prior to printing the etch resist mask.

9. The process according to claim 1 wherein printing an etch resist mask further comprises supplying an electric potential between the conductive layer and a print head of a printer used to print the etch resist mask.

10. The process according to claim 9 wherein the electrical potential is in the range of between about 50–300 volts.

11. The process according to claim 1 wherein printing an etch resist mask comprises printing an etch resist mask to directly to the conductive layer using an inkjet printer.

12. The process according to claim 1 wherein printing an etch resist mask comprises offset printing an etch resist mask to the conductive layer using an inkjet printer in an offset mode.

13. The process according to claim 1 wherein printing an etch resist mask comprises flexing the substrate and the conductive layer over a support roller disposed adjacent to a print head of a printer, wherein the etch resist mask is printed directly to the conductive layer flexed into an arcuate configuration.

14. The process according to claim 1 wherein printing an etch resist mask comprises retaining the substrate to a compliant member, the compliant member being disposed on a rigid member, whereby the substrate is capable of displacement in a direction that is orthogonal to a tangent printing plane of at least one print drum or print head.

15. The process according to claim 14 wherein retaining the substrate to the compliant member comprises applying an at least partial vacuum between the substrate and the compliant member.

16. The process according to claim 14 wherein retaining the substrate to the compliant member comprises retaining the substrate on locating pins.

17. The process according to claim 1 further comprising subjecting the printed etch resist mask to a mild solvent after the etch resist mask has been at least partially set, thereby smoothing the edges of the etch resist mask.

18. The process according to claim 17 wherein the mild solvent comprises at least one of N-methyl pyrrolidone, butoxy ethyl acetate, cymene, xylene, toluene, and other members of the cellusolve group of chemicals.

19. The process according to claim 1 further comprising printing a subsequent etch resist mask on to at least one of at least a portion of the conductive layer and the etch resist mask.

20. The process according to claim 19 wherein the subsequent etch resist mask is positioned based on at least one of at least a portion of the etch resist mask and an index marking applied to at least one of the substrate and the conductive layer.

21. The process according to claim 1 further comprising:
    printing a second etch resist mask directly onto at least a portion of a second conductive layer disposed on the substrate, leaving at least an exposed portion of the second conductive layer; and removing the exposed portion of the second conductive layer.

22. A process for forming a printed circuit comprising:

ascertaining positional errors in a printer by printing a test pattern representative of a known standard, and comparing the printed test pattern to the known standard;

manipulating printer inputs to compensate for the ascertained positional errors, whereby the printer is corrected for positional errors;

printing a plating mask directly onto at least a portion of a conductive layer disposed on a substrate, leaving at least an exposed portion of the conductive layer; and depositing a conductive material onto the exposed portion of the conductive layer.

23. The process according to claim 22 wherein depositing a conductive material onto the exposed portion of the conductive layer comprises electroless plating.

24. The process according to claim 22 wherein depositing a conductive material onto the exposed portion of the conductive layer comprises electroplating.

25. The process according to claim 22 wherein depositing a conductive material onto the exposed portion of the conductive layer comprises vacuum deposition.

26. The process according to claim 22 wherein the printer comprises a laser printer.

27. The process according to claim 26 wherein printing the plating mask comprises a dry toner printed by the laser printer.

28. The process according to claim 26 wherein printing a plating mask comprises offset laser printing a plating mask onto the conductive layer.

29. The process according to claim 22 wherein the printer comprises an inkjet printer.

30. The process according to claim 29 wherein printing a plating mask comprises offset inkjet printing a plating mask onto at least a portion of the conductive layer.

31. The process according to claim 22 further comprising setting the plating mask.

32. The process according to claim 31 wherein setting the plating mask comprises heating the plating mask.

33. The process according to claim 31 wherein setting the plating mask comprises exposing the plating mask to at least one of infrared radiation and ultraviolet radiation.

34. The process according to claim 22 wherein printing the plating mask comprises applying a voltage between a print head and the substrate.

35. The process according to claim 34 wherein applying a voltage between a print head and the substrate comprises applying a voltage between the print head and a conductive member disposed adjacent to a bottom surface of the substrate.

36. The process according to claim 34 wherein the voltage is in the range of between about 50–300 volts.

37. The process according to claim 22 wherein printing the plating mask comprises flexing the substrate over a support roller disposed adjacent to a print head of a printer, wherein the plating mask is printed to the substrate flexed into an arcuate configuration.

38. The process according to claim 22 wherein printing the plating mask comprises retaining the substrate to a compliant member, the compliant member being disposed on a rigid member, whereby the substrate is capable of displacement in a direction that is orthogonal to a tangent printing plane of at least one print drum or print head.

39. The process according to claim 38 wherein retaining the substrate to the compliant member comprises applying an at least partial vacuum between the substrate and the compliant member.

40. The process according to claim 38 wherein retaining the substrate to the compliant member comprises retaining the substrate on locating pins.

41. The process according to claim 22 further comprising subjecting the printed plating mask to a mild solvent after the plating mask has been at least partially set, thereby smoothing the edges of the plating mask.

42. The process according to claim 41 wherein the mild solvent comprises at least one of N-methyl pyrrolidone, butoxyethylacetate, cymene, xylene, toluene, and other members of the cellusolve group of chemicals.

43. The process according to claim 22 further comprising printing a subsequent plating mask onto at least a portion of one of the conductive layer and the plating mask.

44. The process according to claim 43 wherein the subsequent plating mask is positioned based on at least one of at least a portion of the plating mask, an index marking applied to the substrate, and at least one through hole in the substrate.

45. The process according to claim 22 further comprising:

printing a second plating mask onto at least a portion of a second conductive layer disposed on the substrate, leaving at least an exposed portion of the second conductive layer;

depositing a conductive material onto at least a portion of the exposed portion of the second conductive layer.

46. A method of printing a pattern mask onto a substrate comprising:

ascertaining positional errors in a printer by printing a test pattern representative of a known standard, and comparing the printed test pattern to the known standard;

manipulating printer inputs to compensate for the ascertained positional errors, whereby the printer is corrected for positional errors;

printing a first pattern mask onto the substrate, using the printer that is corrected for positional errors;

detecting the position of the first pattern mask;

printing a second pattern mask onto the substrate corresponding to the detected position of the first pattern mask, using a printer that has been corrected for positional errors.

47. The method according to claim 46 wherein detecting the position of the first pattern mask comprises optically scanning the substrate having the first pattern mask thereon.

48. The method according to claim 47 wherein optically scanning the substrate comprises optically scanning the substrate with a scanner that has been error corrected by:

ascertaining errors in the scanner by scanning a known standard, and comparing the detected image to the standard; and manipulating scanner outputs to compensate for the ascertained errors.

49. The method according to claim 46 comprising printing at least one index marking onto the substrate prior to printing the first pattern mask, detecting the position and orientation of the at least one index marking, and printing the first pattern mask corresponding to the detected position and orientation of the at least one index marking.

50. The method according to claim 49 wherein detecting the position and orientation of the at least one index marking comprises optically scanning the substrate having the at least one index marking printed thereon.

51. The method according to claim 49 wherein printing the second pattern mask comprises printing the second pattern mask onto the substrate corresponding to the detected position of the at least one index marking.

52. A process for forming a two-sided printed circuit comprising:
  correcting errors in at least one laser printer by ascertaining positional errors in the at least one printer by printing a test pattern representative of a known standard, comparing the printed test pattern to the known standard, and manipulating printer inputs to compensate for the ascertained positional errors;
  laser printing a first pattern mask directly onto at least a portion of a first conductive layer disposed on a substrate, with the at least one laser printer, leaving an exposed portion of the first conductive layer;
  laser printing a second pattern mask directly onto at least a portion of a second conductive layer disposed on the substrate, with the at least one laser printer, leaving an exposed portion of the second conductive layer;
  removing the exposed portion of the first conductive layer; and
  removing the exposed portion of the second conductive layer.

53. The process according to claim 52, wherein the first pattern mask is printed with the same laser printer as the second pattern mask.

54. The process according to claim 52, wherein the first pattern mask is printed with a different laser printer than the second pattern mask.

55. The process according to claim 52 wherein at least the first pattern mask comprises dry laser printer toner.

56. The process according to claim 52 wherein at least the second pattern mask comprises dry laser printer toner.

57. The process according to claim 52 further comprising cleaning a surface of the first and the second conductive layers prior to printing the respective first and second pattern masks.

58. The process according to claim 57 wherein cleaning a surface of the first and the second conductive layers comprises chemical-machine-polishing.

59. The process according to claim 52 wherein laser printing the first pattern mask includes providing an electrical potential between a print drum of the at least one laser printer and the first conductive layer, and wherein laser printing the second pattern mask includes providing an electrical potential between a print drum of the at least one laser printer and the second conductive layer.

60. The process according to claim 59 wherein providing an electrical potential between the print drum and the first conductive layer comprises providing an electrical potential of between about 50–300 volts, and wherein providing an electrical potential between the print drum and the second conductive layer comprises providing an electrical potential of between about 50–300 volts.

61. The process according to claim 52 wherein laser printing a first pattern mask comprises flexing the substrate over a support roller disposed adjacent to a print drum of the at least one laser printer, wherein the pattern mask is printed to the first conductive layer flexed into an arcuate configuration.

62. The process according to claim 52 wherein laser printing a second pattern mask comprises flexing the substrate over a support roller disposed adjacent to a print drum of the at least one laser printer, wherein the pattern mask is printed to the second conductive layer flexed into an arcuate configuration.

63. The process according to claim 52 wherein laser printing the first pattern mask comprises retaining the substrate to a compliant member, the compliant member being disposed on a rigid member, whereby the substrate is capable of displacement in a direction that is orthogonal to a tangent printing plane of a print drum of the at least one laser printer.

64. The process according to claim 52 wherein laser printing the second pattern mask comprises retaining the substrate to a compliant member, the compliant member being disposed on a rigid member, whereby the substrate is capable of displacement in a direction that is orthogonal to an axis of a print drum of the at least one laser printer.

* * * * *